United States Patent
Hirayama et al.

(10) Patent No.: US 7,616,516 B2
(45) Date of Patent: Nov. 10, 2009

(54) SEMICONDUCTOR DEVICE

(75) Inventors: Masayuki Hirayama, Tachikawa (JP); Masami Hasegawa, Ome (JP); Michitaro Kanamitsu, Ome (JP); Yayoi Hayashi, Akishima (JP); Naoyuki Anan, Hino (JP)

(73) Assignee: Hitachi ULSI Systems Co., Ltd, Tokyo (JP)

( * ) Notice: Subject to any disclaimer, the term of this patent is extended or adjusted under 35 U.S.C. 154(b) by 5 days.

(21) Appl. No.: 12/109,339

(22) Filed: Apr. 24, 2008

(65) Prior Publication Data

US 2008/0266937 A1    Oct. 30, 2008

(30) Foreign Application Priority Data

Apr. 26, 2007    (JP) .............................. 2007-116484

(51) Int. Cl.
*G11C 5/14*    (2006.01)
(52) U.S. Cl. ....................... 365/226; 365/154
(58) Field of Classification Search ................. 365/226, 365/154, 156
See application file for complete search history.

(56) References Cited

U.S. PATENT DOCUMENTS

| | | | |
|---|---|---|---|
| 6,643,173 B2 * | 11/2003 | Takemura | ............... 365/185.05 |
| 6,839,299 B1 * | 1/2005 | Bhavnagarwala et al. | ... 365/226 |
| 6,977,519 B2 * | 12/2005 | Bhavnagarwala et al. | ..... 326/34 |
| 6,999,338 B1 | 2/2006 | Hirabayashi | |
| 7,092,307 B2 * | 8/2006 | Chen et al. | ................... 365/226 |
| 7,200,030 B2 | 4/2007 | Yamaoka et al. | |

FOREIGN PATENT DOCUMENTS

| | | |
|---|---|---|
| JP | 2004-206745 A | 7/2004 |
| JP | 2006-073065 A | 3/2006 |

* cited by examiner

*Primary Examiner*—Anh Phung
(74) *Attorney, Agent, or Firm*—Miles & Stockbridge P.C.

(57) ABSTRACT

A semiconductor device of the present invention has a memory cell array having plural CMOS static memory cells provided at intersecting portions of plural word lines and plural complementary bit lines. In the memory cell array, a switch MOSFET which is in an OFF state in a first operation mode and in an ON state in a second operation mode different from the first operation mode and first-conductivity-type and second-conductivity-type MOSFETs having a diode configuration are provided in parallel between a first source line to which sources of first-conductivity-type MOSFETs constituting first and second CMOS inverter circuits constituting the plural static memory cells are connected and a first power supply line corresponding to the first source line. A second source line to which sources of the second conductivity-type MOSFETs constituting the first and second CMOS inverter circuits are connected is connected to the second power supply line corresponding thereto.

8 Claims, 8 Drawing Sheets

SEMICONDUCTOR DEVICE

CROSS-REFERENCE TO RELATED APPLICATION

The present application claims priority from Japanese Patent Application No. JP 2007-116484 filed on Apr. 26, 2007, the content of which is hereby incorporated by reference into this application.

TECHNICAL FIELD OF THE INVENTION

The present invention relates to a semiconductor device. More particularly, it relates to a technique effectively applied to a technique for reducing the leakage current during standby of a semiconductor device having a memory cell array composed of static memory cells.

BACKGROUND OF THE INVENTION

As an example of the case where a potential control circuit is provided on a source line of a static memory cell and the source potential is controlled to an intermediate potential during standby of the memory cell by the potential control circuit, thereby reducing the leakage current, Japanese Patent Application Laid-Open Publication No. 2004-206745 (Patent Document 1) has been proposed. Further, as an example of the case where additional MOSFETs are provided on either one of a power supply line and a ground line of a memory cell and a bias voltage which reflects either one or both of variations in the threshold voltage of the MOSFETs constituting a cross feedback circuit of the memory cell during standby of the memory cell is formed and controlled, Japanese Patent Application Laid-Open Publication No. 2006-073065 (Patent Document 2) has been proposed.

SUMMARY OF THE INVENTION

In the above-described Patent Document 1, the potential control circuit which controls the source potential to the intermediate potential uses an N-channel MOSFET having a diode configuration for suppressing the potential increase of the source line on the ground potential side or uses a P-channel MOSFET having a diode configuration for suppressing the potential reduction of the source potential on the power supply voltage side. Therefore, when the threshold voltage of a conduction MOSFET corresponding to the MOSFET constituting the potential control circuit is varied to be increased due to process variation, the intermediate potential is increased accordingly. To describe it using an example of the N-channel MOSFET, when both the threshold voltages of the N-channel MOSFET of a memory cell and the N-channel MOSFET constituting the potential control circuit are increased, the voltage between the gate and the source of the N-channel MOSFET required to maintain the ON state is increased due to the increase of the threshold voltage of the N-channel MOSFET in the memory cell. On the other hand, the N-channel MOSFET constituting the potential control circuit has a problem that it operates to increase the intermediate potential of the source line and decrease the voltage between the gate and the source required for the ON state. As described above, in the technique of the Patent Document 1, the problem in the data retention characteristics occurs when the variation in the threshold voltage due to the process variation of MOSFETs is large.

In the above-described Patent Document 2, the current flowing through a circuit in which P-channel MOSFETs having a diode configuration are connected in series and the current flowing through a circuit in which an N-channel MOSFET and a P-channel MOSFET having a diode configuration are connected in series are caused to flow through a resistor to form the bias voltage, thereby forming the bias voltage which compensates for the process variation. However, since the bias voltage is obtained by causing the currents formed in the above-described series circuits of MOSFETs to flow through the resistor, in addition to the threshold voltages of the two P-channel MOSFETs and the P-channel MOSFET and the N-channel MOSFET, a large operation voltage is required for generating the voltage larger than the bias voltage in the resistor. Therefore, there occurs a problem that the lower-limit operation voltage is limited to a comparatively large voltage that is required for generating the above-described bias voltage.

An object of the present invention is to provide a semiconductor device capable of reducing the current consumption during standby with a simple configuration. The above and other objects and novel characteristics of the present invention will be apparent from the description of this specification and the accompanying drawings.

An embodiment disclosed in this application is as follows. A semiconductor device comprises: a memory cell array having plural CMOS static memory cells provided at intersecting portions of plural word lines and plural complementary bit lines. In the memory cell array, between a first source line to which sources of first conductivity-type MOSFETs constituting first and second CMOS inverter circuits constituting the plural static memory cells are connected and a first power supply line corresponding to the first source line, a switch MOSFET which is turned to an OFF state in a first operation mode and to an ON state in a second operation mode different from the first operation mode and first conductivity-type and second conductivity-type MOSFETs having a diode configuration are provided in parallel. A second source line to which the sources of the second conductivity-type MOSFETs constituting the first and second CMOS inverter circuits are connected is connected to the second power supply line corresponding to the second source line.

Another embodiment disclosed in this application is as follows. A semiconductor device comprises: first and second circuit blocks which become operable when first and second power supply voltages are fed; and a power supply control circuit. In the first circuit block, the first or second power supply voltage is cut off in a first operation mode by a control signal from the power supply control circuit, and the first and second power supply voltages are fed in a second operation mode which is different from the first operation mode. In the second circuit block, the first power supply voltage and the second power supply voltage are fed in the first and second operation modes. The second circuit block has a memory cell array having plural CMOS static memory cells provided at intersecting portions of plural word lines and plural complementary bit lines. In the memory cell array, between a first source line to which sources of first conductivity-type MOSFETs constituting first and second CMOS inverter circuits constituting the plural static memory cells are connected and a first power supply line corresponding to the first source line, a switch MOSFET which is turned to an OFF state in a first operation mode and to an ON state in a second operation mode different from the first operation mode and first conductivity-type and second conductivity-type MOSFETs having a diode configuration are provided in parallel. A second source line to which the sources of the second conductivity-type MOSFETs constituting the first and second CMOS inverter circuits are connected is connected to the second power supply line corresponding to the second source line.

The source potential of the static memory cell is controlled to an intermediate potential in accordance with smaller one of the threshold voltages of the P-channel MOSFET and N-channel MOSFET. Therefore, both the reduction of leakage current and the data retention can be achieved. The power consumption of the semiconductor device including a logic circuit and an SRAM can be reduced.

BRIEF DESCRIPTIONS OF THE DRAWINGS

DESCRIPTIONS OF THE PREFERRED EMBODIMENTS

Figure 1:
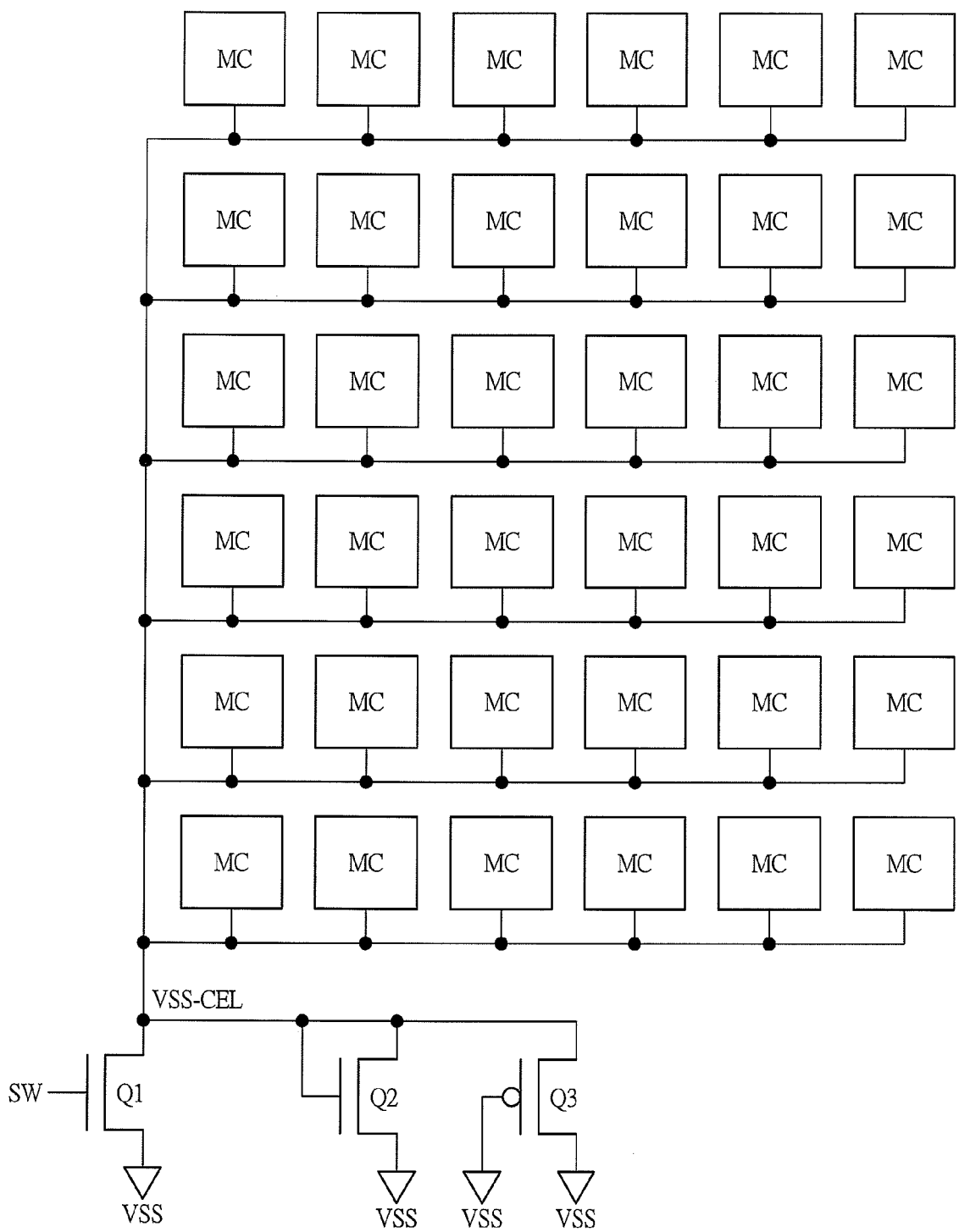
FIG. 1 is a schematic block diagram showing an embodiment of a memory cell array unit of an SRAM mounted on a semiconductor device according to the present invention.

FIG. 1 shows a schematic block diagram of an embodiment of a memory cell array unit of a static RAM (hereinafter, referred to as an SRAM) mounted on a semiconductor device according to the present invention. In the memory cell array, plural memory cells MC are disposed at intersecting portions of word lines and complementary bit lines in a matrix. In FIG. 1, as a typical example, six memory cells MC in the word line direction (lateral direction) and six memory cells MC in the bit line direction (vertical direction) are shown.

Figure 2:
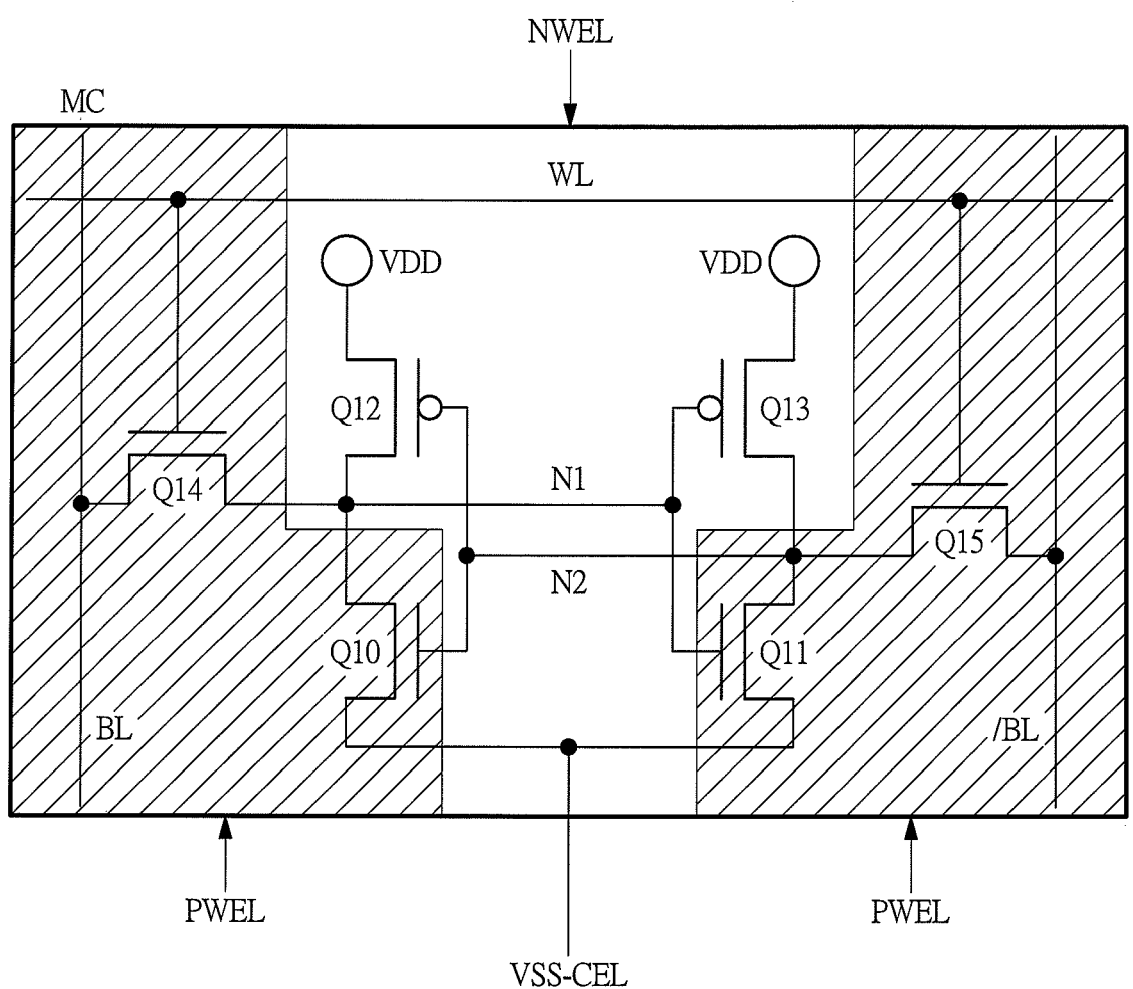
FIG. 2 is a circuit diagram showing an embodiment of a memory cell MC of FIG. 1.

FIG. 2 shows a circuit diagram of an embodiment of the memory cell MC. The input and output of a first CMOS inverter circuit composed of an N-channel MOSFET Q10 and a P-channel MOSFET Q12 and those of a second CMOS inverter circuit composed of an N-channel MOSFET Q11 and a P-channel MOSFET Q13 are cross-connected to form a latch circuit. In this embodiment, power supply voltages VDD are fed to the P-channel MOSFETs Q12 and Q13. The sources of the N-channel MOSFETs Q10 and Q11 are connected to a source line VSS-CEL. An N-channel MOSFET Q14 is provided between one input/output node N1 of the latch circuit and a non-inversion (true) bit line BL. An N-channel MOSFET Q15 is provided between the other input/output node N2 of the latch circuit and an inversion (bar) bit line /BL. The gates of the N-channel MOSFETs Q14 and Q15 are connected to a word line WL.

In the above-described memory cell MC, the P-channel MOSFETs Q12 and Q13 and the cross-connected input/output nodes N1 and N2 are disposed in a center portion. These circuit components are formed on an N-well NWEL. P-wells PWEL are provided as shown by oblique lines on the right and left sides of the N-well NWEL so as to sandwich the N-well NWEL. The above-described N-channel MOSFETs Q10 and Q14 and the N-channel MOSFETs Q11 and Q15 are allocated to and provided for these left and right P-wells PWEL.

In FIG. 1, a plurality of the above-described memory cells MC as shown in FIG. 2 constitute the memory cell array, and the sources of the above-described N-channel MOSFETs (Q10 and Q11) are commonly connected to the source line VSS-CEL. A source line control circuit is provided on the source line VSS-CEL. The source line control circuit is configured of MOSFETs Q1 to Q3. The N-channel MOSFET Q1 is provided between the source line VSS-CEL and a ground line VSS (or GND) of the circuit and subjected to switch control by a control signal SW. Both the gate and the drain of the N-channel MOSFET Q2 are commonly connected to the source line VSS-CEL so as to have a diode configuration. Similarly, the gate and the drain of the P-channel MOSFET Q3 are commonly connected to the ground line VSS of the circuit so as to have a diode configuration.

Figure 3:
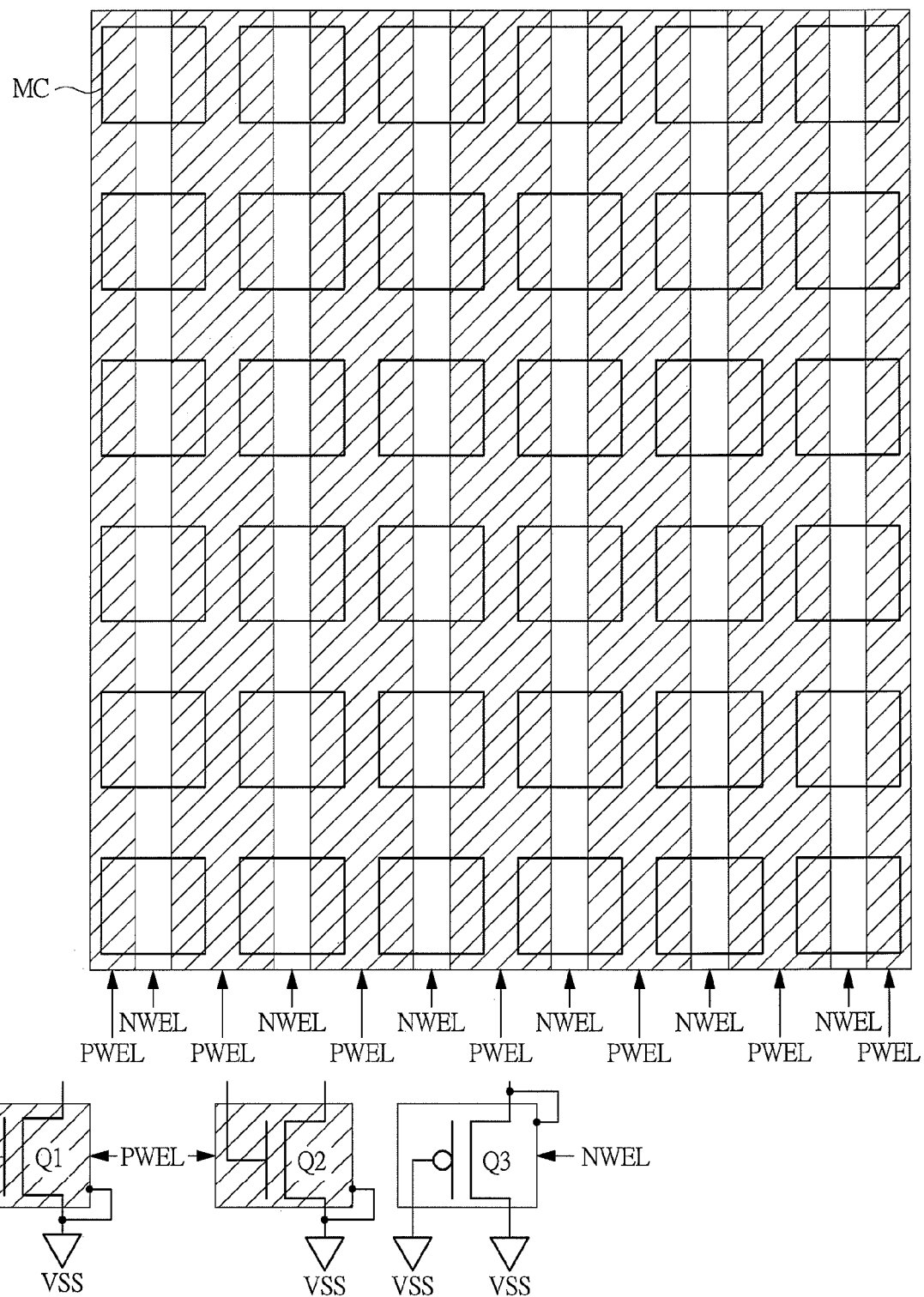
FIG. 3 is a well layout diagram showing an embodiment of the memory cell array unit of FIG. 1.

FIG. 3 shows a well layout diagram of the embodiment of the memory cell array unit of FIG. 1. The N-wells NWEL and P-wells PWEL on which the N-channel MOSFETs and P-channel MOSFETs of the memory cells MC are formed are common in the memory cells MC arranged in the bit line direction (vertical direction). Further, each of the P-wells PWEL is common in the memory cells MC adjacent in a lateral direction. The ground potential VSS of the circuit is fed to the P-wells PWEL of the memory cell array unit. The power supply voltage VDD is fed to the N-wells NWEL of the memory cell array unit.

The N-well NWEL on which the P-channel MOSFET Q3 of the source line control circuit is formed is not connected to the power supply voltage VDD like the P-wells PWEL of the memory cell array unit, but connected to the source of the MOSFET Q3, that is, the source line VSS-CEL of FIG. 1. The ground potential VSS of the circuit is fed to the P-wells PWEL on which the N-channel MOSFETs Q1 and Q2 of the source line control circuit are formed. Therefore, the MOSFETs Q1 and Q2 may be formed on the same P-well PWEL or may be formed on the P-well PWEL on which the N-channel MOSFETs of the memory cells MC are formed.

Figure 4:
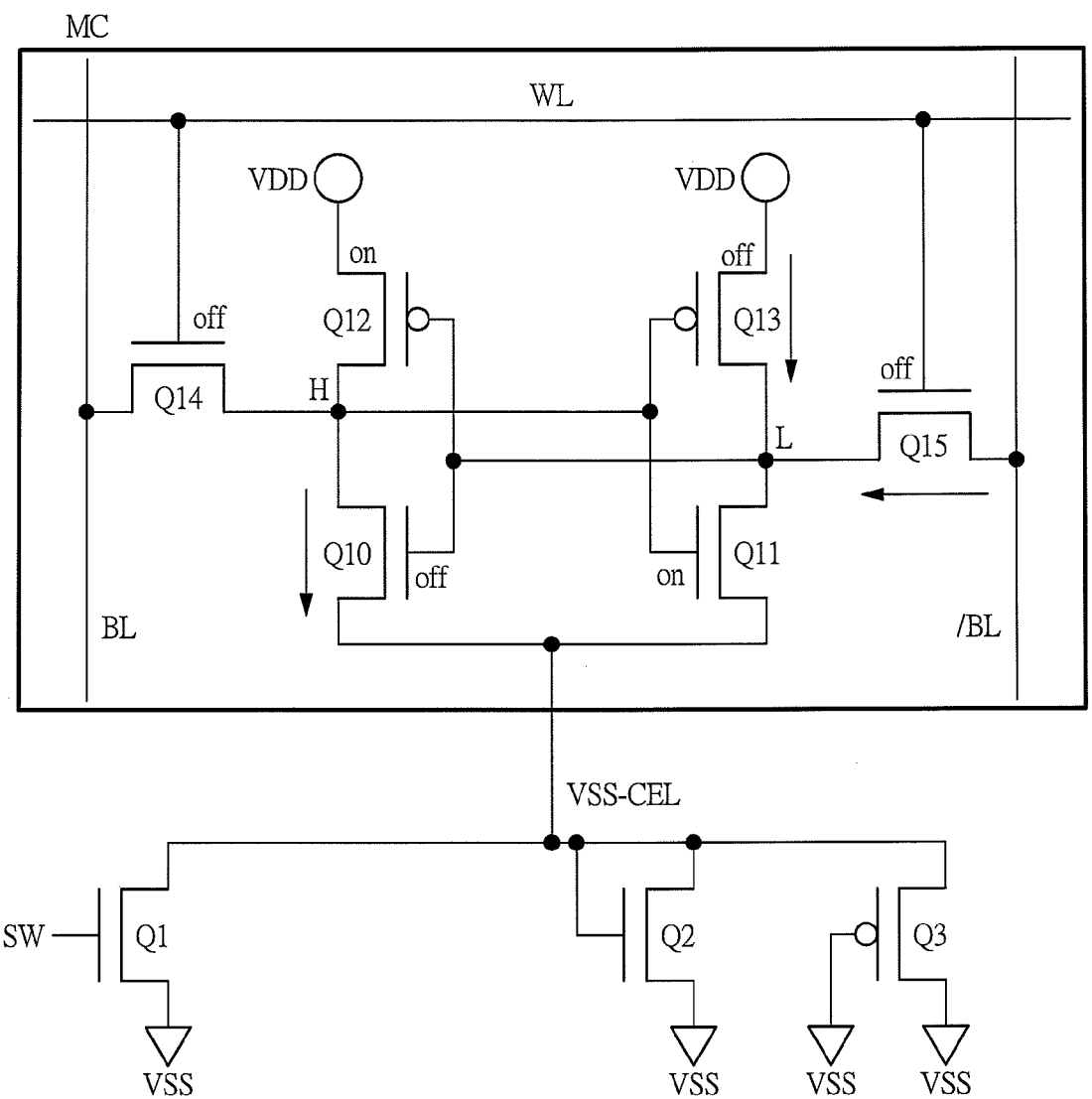
FIG. 4 is a circuit diagram of one memory cell MC and a source line control circuit in FIG. 1.

FIG. 4 shows a circuit diagram of one memory cell MC and the source line control circuit. Each memory cell MC of the memory cell array retains a high level (H) and a low level (L) in the above-described latch circuit, for example, in the manner shown in this diagram. Since the P-channel MOSFET Q12 is in an ON state in the first CMOS inverter circuit, when a leakage current is generated in the MOSFET Q10 which is in an OFF state, the leakage current flows to the above-described ground line VSS. Similarly, since the N-channel MOSFET Q11 is in an ON state in the second CMOS inverter circuit, when a leakage current is generated in the P-channel MOSFET Q13 which is in an OFF state, the leakage current flows to the above-described ground line VSS. Furthermore, in the case where the inversion bit line /BL is the high level, when a leakage current is generated in the MOSFET Q15 which is turned to an OFF state by a non-selected state of the word line WL in the low level, the leakage current flows to the above-described ground line VSS through the above-described MOSFET Q11.

Figure 5A:
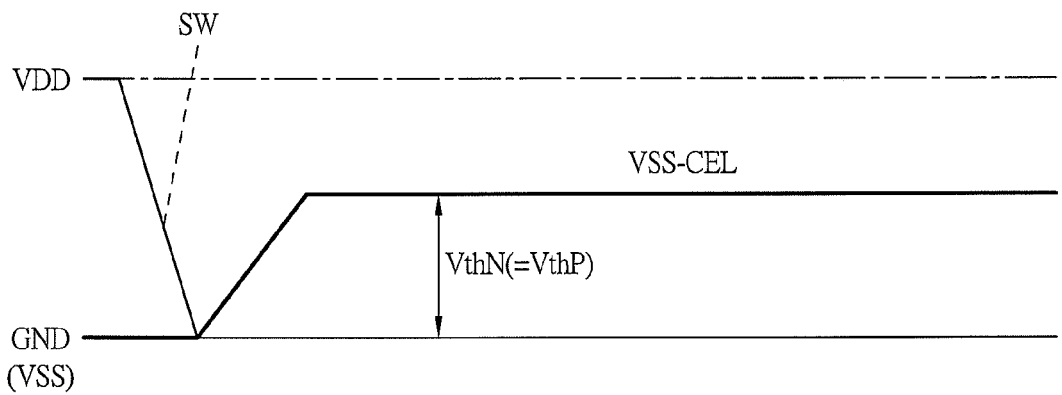
FIG. 5A is a waveform diagram for describing the operation of the source line control circuit according to the present invention.
Figure 5B:
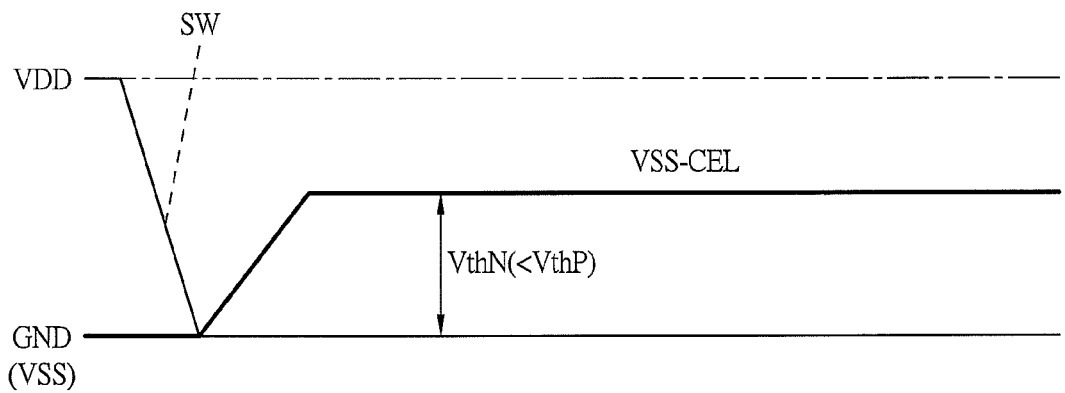
FIG. 5B is a waveform diagram for describing the operation of the source line control circuit according to the present invention.
Figure 5C:
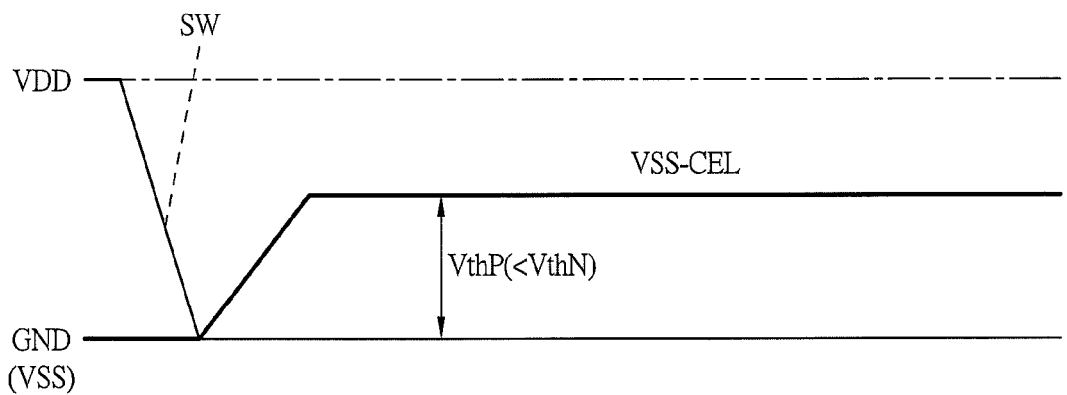
FIG. 5C is a waveform diagram for describing the operation of the source line control circuit according to the present invention.

FIGS. 5A to 5C show waveform charts for describing the operation of the source line control circuit according to the present invention. When the SRAM including the above-described memory cell array or the semiconductor device itself including the SRAM is in a standby state, the above-described control signal SW is changed from a high level to a low level. As a result, the above-described MOSFET Q1 is changed from the ON state to the OFF state. When the leakage current as shown in FIG. 4 is generated in the above-described latch circuit in each of the memory cells MC of the memory cell array, the leakage current flows to the above-described ground line VSS. Even though the amount of leakage current generated in each memory cell MC is small, since numerous memory cells MC are present in the memory cell array, the total current that flows to the ground line VSS is unignorable.

Parasitic capacitance is present in the ground line VSS because the sources of the N-channel MOSFETs of numerous memory cells MC as described above are connected thereto and because of the wirings mutually connecting them. When the MOSFET Q1 is in an OFF state in the above-described manner, the above-described parasitic capacitance is charged up by the above-described leakage current, and the potential thereof is increased.

In the example of FIG. 5A, in the case where the threshold voltage VthN of the N-channel MOSFET Q2 and the threshold voltage VthP of the P-channel MOSFET are equal, when the source line VSS-CEL reaches the above-described threshold voltage VthN (=VthP), these MOSFETs Q2 and Q3 are turned to an ON state and cause the above-described leakage current to flow to the ground line VSS. Therefore, the potential increase caused by the above-described leakage current is restricted, and a constant potential is maintained in accordance with the above-described threshold voltage VthN (=VthP). In the above-described P-channel MOSFET Q3, the source and the N-well NWEL serving as a substrate gate are commonly connected. Therefore, even when the potential of the source line VSS-CEL fed to the source is an intermediate potential, the back bias voltage is not applied to the source and the substrate gate. Therefore, when the above-described source line VSS-CEL reaches the threshold voltage VthP, the P-channel MOSFET Q3 becomes an ON state.

In the example of FIG. 5B, in the case where the threshold voltage VthP of the P-channel MOSFET Q3 is larger than the threshold voltage VthN of the N-channel MOSFET Q2 (VthN<VthP), when the source line VSS-CEL reaches the above-described threshold voltage VthN, the MOSFET Q2 becomes an ON state and causes the leakage current to flow to the ground line VSS. Therefore, the potential increase caused by the above-described leakage current is restricted, and a constant potential is maintained in accordance with the threshold voltage VthN.

In the example of FIG. 5C, in the case where the threshold voltage VthN of the N-channel MOSFET Q2 is larger than the threshold voltage VthP of the P-channel MOSFET Q3 (VthP<VthN), when the source line VSS-CEL reaches the above-described threshold voltage VthP, the MOSFET Q3 becomes an ON state and causes the above-described leakage current to flow to the ground line VSS. Therefore, the potential increase caused by the leakage current is restricted, and a constant potential is maintained in accordance with the threshold voltage VthP.

In the source line control circuit of the present embodiment, the potential of the source line VSS-CEL can be restricted in accordance with the smaller one of the threshold voltages of the N-channel MOSFET Q2 and the P-channel MOSFET Q3. For example, to describe it using an example of the N-channel MOSFET, when both the threshold voltages of the N-channel MOSFET of a memory cell and the N-channel MOSFET constituting the source line control circuit are increased, the voltage between the gate and the source of the N-channel MOSFET required to maintain the ON state is increased due to the increase of the threshold voltage of the N-channel MOSFET in the memory cell. On the other hand, in the above-described source line control circuit, the increase of the source line VSS-CEL is restricted in accordance with the threshold voltage of the P-channel MOSFET as shown in FIG. 5C, without being affected by the increase of the threshold voltage of the N-channel MOSFET. Meanwhile, even when the threshold voltage of the P-channel MOSFET is increased due to process variation, the increase in the source line VSS-CEL is restricted in accordance with the threshold voltage of the N-channel MOSFET Q2 as shown in FIG. 5B.

In the case of a CMOS circuit which is configured of an N-channel MOSFET and a P-channel MOSFET, when variations in the threshold voltage of the N-channel MOSFET and the threshold voltage of the P-channel MOSFET are generated in the manner totally irrelevant to each other, although the probability that the threshold voltage of the N-channel MOSFET is increased is ½, the probability that the threshold voltages of both the N-channel MOSFET and the P-channel MOSFET are increased is as small as ¼. Therefore, the influence thereof on the data retention characteristics of the memory cell can be reduced. As described above, the power supply voltage VDD is set by the source line VSS-CEL which is set by the smaller one of the threshold voltages VthN and VthP so that the data retention operation is carried out in the memory cell MC. By this means, both the reduction of the leakage current and data retention operation can be achieved.

In the case where the power supply voltage required for the data retention operation in the memory cell MC when the above-described source line VSS-CEL is at an intermediate potential is VDD', when it is smaller than the power supply voltage VDD fed during the operation of the SRAM, the power supply voltage VDD of the memory cell array may be reduced to the above-described VDD' in addition to turning the MOSFET Q1 (Q4) to an OFF state by the control signal SW in the above-described standby state. Therefore, in a semiconductor integrated circuit device as shown later in FIG. 8, a step-down power supply circuit which forms the above-described VDD' is provided in a power supply control circuit SWC.

Note that the ground potential VSS of a circuit is provided as the potential of the P-wells on which the N-channel MOSFETs formed in the memory cell array are formed. On the other hand, the source of each of the N-channel MOSFETs is connected to the source line VSS-CEL, and the intermediate potential (for example, VthN or the like) is achieved by the source line control circuit during the standby. Therefore, in the memory cell MC, the back bias voltage is applied to the source and the substrate gate as described above, and the leakage current can be reduced.

Figure 6:
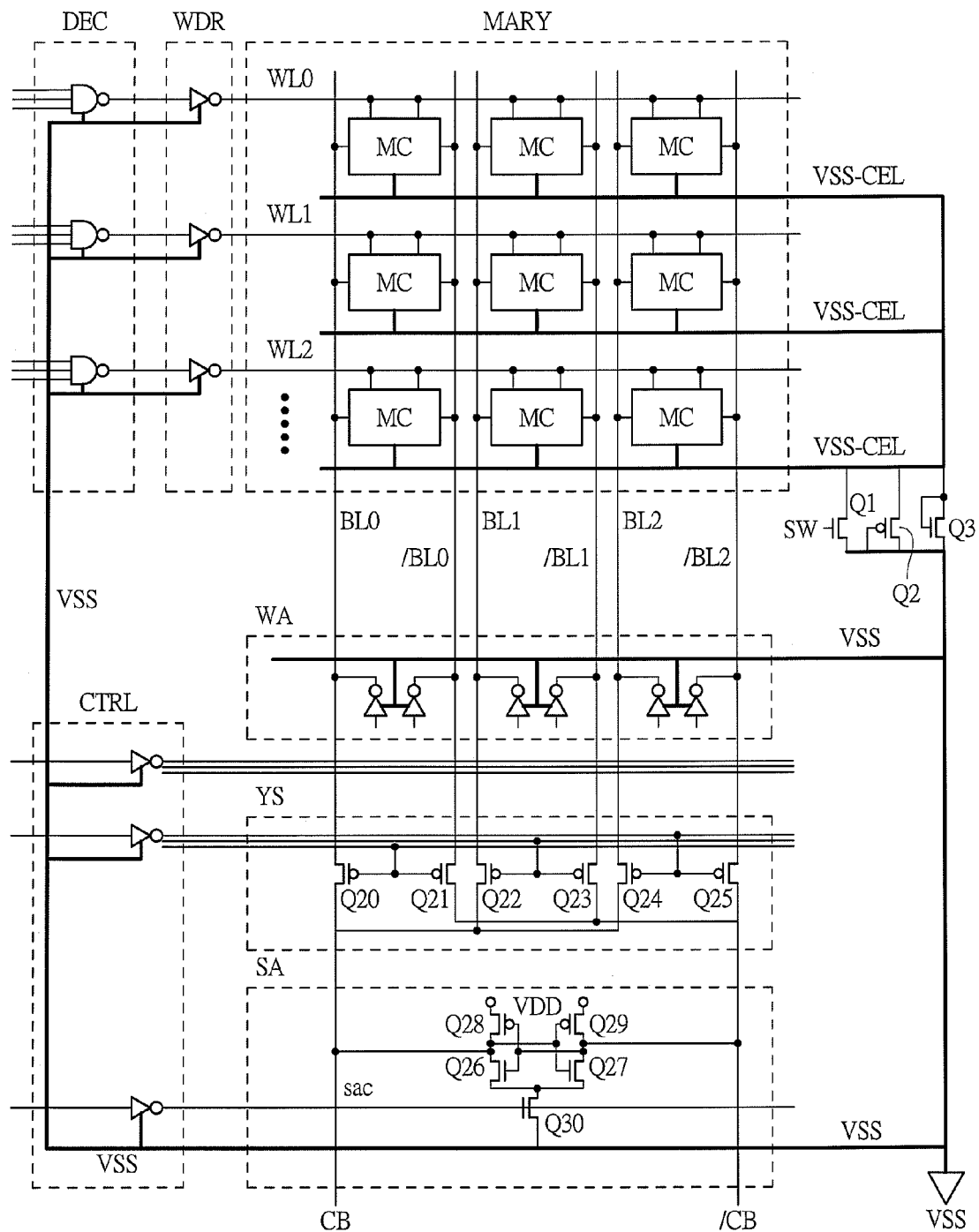
FIG. 6 is an overall circuit diagram showing an embodiment of the SRAM according to the present invention.

FIG. 6 shows an overall circuit diagram of an embodiment of the static RAM according to the present invention. The static RAM is configured of the memory cell array and an address selecting circuit, a reading circuit, a writing circuit, and the like provided in the peripheral circuit thereof.

As a typical example of the memory cell array, three word lines WL1 to WL3, three pairs of complementary bit lines BL0 and /BL0 to BL2 and /BL2, and nine memory cells MC provided at the intersecting points thereof are shown. The above-described memory cell MC is configured of the latch circuit in which the inputs and outputs of two CMOS inverter circuits composed of the N-channel MOSFETs Q10 and Q11 and the P-channel MOSFETs Q12 and Q13 as shown in FIG. 2 are cross-connected and a selection switch configured of the N-channel MOSFETs Q14 and Q15, which are provided between a pair of input/output nodes of the latch circuit and the bit lines BL and /BL.

Though not particularly limited, 256 memory cells are disposed on one word line WL in an actual memory cell array. Therefore, the complementary bit lines BL and /BL are configured of 256 pairs such as from BL0 and /BL0 to BL255 and /BL255. For example, 256 memory cells are disposed on one pair of the bit lines BL and /BL. Therefore, the word lines include 256 lines such as from WL0 to WL255. A pre-charge and equalize circuit is provided on each of the bit lines BL and /BL though not shown. The pre-charge and equalize circuit is configured of, for example, a P-channel MOSFET which provides a pre-charge voltage such as a power supply voltage to the complementary bit lines BL and /BL and a P-channel MOSFET which short-circuits the complementary bit lines BL and /BL. In addition, P-channel MOSFETs whose gates and drains are cross-connected may be provided as a pull-up MOSFET between the complementary bit lines BL and /BL and a power supply terminal. The pull-up MOSFET prevents a drop of the high-level-side bit line at the time of reading.

Though not particularly limited, the above-described 256 pairs of bit lines are connected to 64 pairs of complementary reading data lines CB and /CB by P-channel MOSFETs Q20, Q21, Q22, Q23, Q24, Q25, and others constituting a reading column switch YS composed of the P-channel MOSFETs. One pair of reading data lines CB and /CB is connected to any one of four pairs of the bit lines BL and /BL. A sense amplifier SA is provided for the above-described reading data lines CB and /CB. The sense amplifier SA is configured of a CMOS latch circuit, in which the inputs and outputs of two CMOS inverter circuits composed of P-channel MOSFETs Q28 and Q29 and N-channel MOSFETs Q26 and Q27 are cross-connected and an N-channel MOSFET Q30 provided to the source of the N-channel MOSFET of the CMOS latch circuit and the ground potential VSS of the circuit. Since the 64 pairs of reading data lines CB and /CB are provided in the above-described manner, 64 sense amplifiers SA are also provided in total.

A sense amplifier selection signal sac formed by a timing generating circuit is fed to the gate of the N-channel MOSFET Q30 which activates the above-described sense amplifier SA. The sense amplifier SA is activated by the selection signal sac to amplify the signals of the reading data lines CB and /CB. The amplified signal of the sense amplifier SA is transmitted to, for example, an output latch circuit, and an output signal dout is formed by an output circuit OB.

In the present embodiment, though not particularly limited, a reading operation in which all the 64 sense amplifiers SA are activated to output a read signal composed of 64 bits, a reading operation in which 32 sense amplifiers SA of the 64 sense amplifiers SA are activated to output a read signal composed of 32 bits, or a reading operation in which 16 sense amplifiers SA of the 64 sense amplifiers SA are activated to output a read signal composed of 16 bits is selectively enabled. The sense amplifier selection signal sac controls the sense amplifiers SA in accordance with the above-described three types of reading operations.

In the present embodiment, a write amplifier WA is provided for each of the bit line pairs BL and /BL. These write amplifiers feed write signals given to writing data lines to the above-described bit line pairs BL and /BL in accordance with the reading operations as described above. Since the write amplifiers WA are provided without through the column switch YS as described above, the selected write amplifiers are activated to perform the writing in a data unit such as 64 bits, 32 bits, or 16 bits as described above. Such selecting operations of the column switches YS and the sense amplifiers SA and a selecting operation of the write amplifiers WA are performed in accordance with the signals from a control circuit CTRL.

One of the 256 word lines WL is selected by a word driver WDR which receives a selection signal formed by a decoder circuit DEC. The decoder circuit DEC receives a timing signal formed by the timing generating circuit and an address signal and forms the selection signal of the word line and a selection signal of a column. In an operation mode such as the standby operation, all the word lines are set at a non-selected level regardless of the address signal. By the column selection signal formed by the decoder circuit, the logic circuit included in the control circuit CTRL performs a selecting operation corresponding to the above-described 32-bit operation, 16-bit operation, and 8-bit operation.

The SRAM of the present embodiment has a plurality of above-described 256×256 memory cell arrays, and the address selecting circuit, the sense amplifiers SA, and the write amplifiers WA as described above are provided in each of them. Also, a plurality of source line control circuits for the reduction of leakage current during standby are also provided for each of the memory cell arrays.

Figure 7:
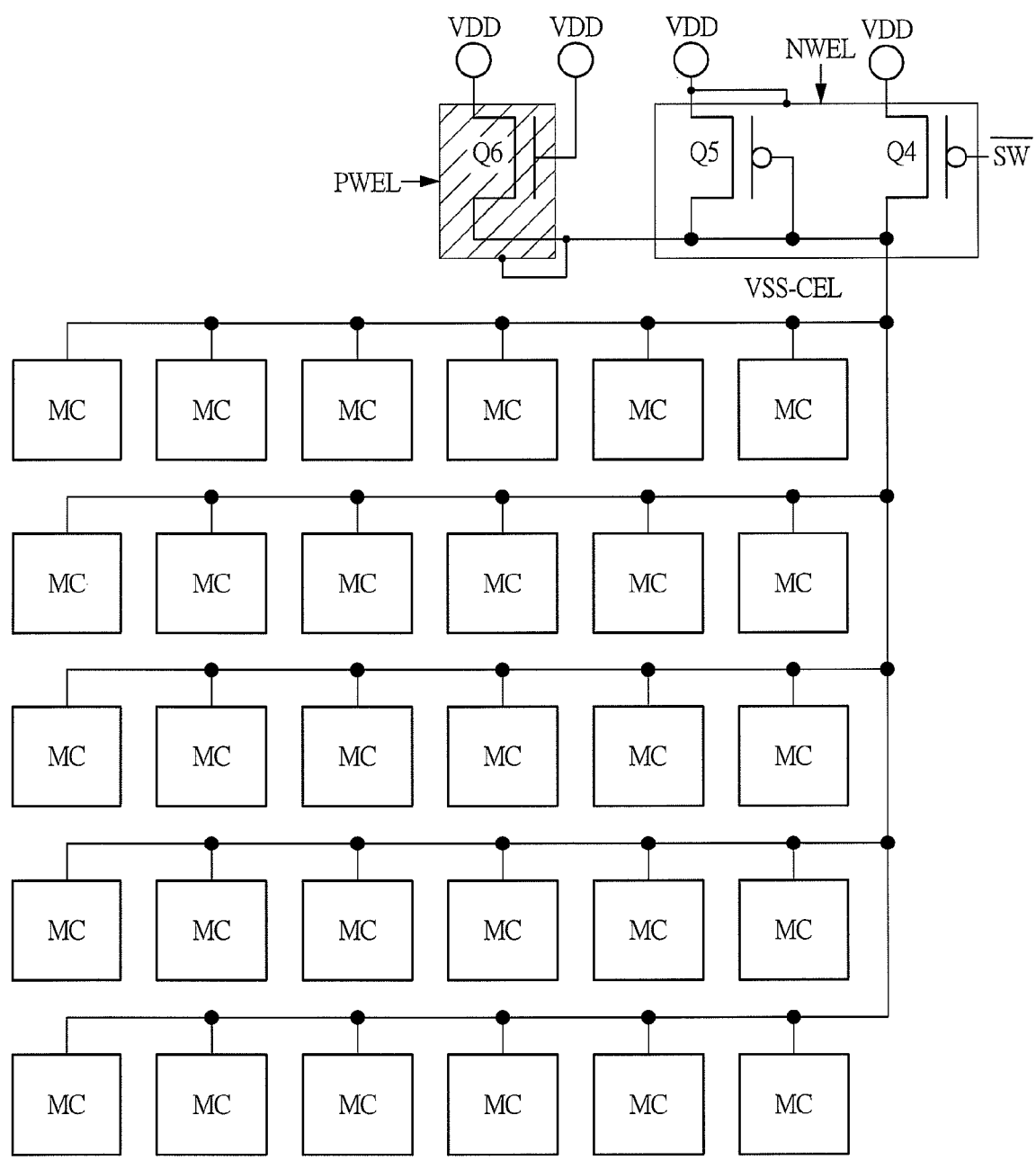
FIG. 7 is a schematic block diagram showing another embodiment of the memory cell array unit in the SRAM according to the present invention.

FIG. 7 shows a schematic block diagram of another embodiment of the memory cell array unit in the SRAM according to the present invention. In the present embodiment, the sources of the P-channel MOSFETs Q12 and Q13 of the memory cell MC are connected to the source line VDD-CEL. The ground potential VSS of the circuit is fed to the sources of the N-channel MOSFETs Q10 and Q11 of the memory cell MC. A source line control circuit is provided on the source line VDD-CEL. The source line control circuit is configured of MOSFETs Q4 to Q6. The P-channel MOSFET Q4 is provided between the source line VDD-CEL and the power supply voltage line VDD and subjected to switch control by a control signal /SW. Both the gate and the drain of the P-channel MOSFET Q5 are commonly connected to the source line VSS-CEL so as to have a diode configuration. Similarly, the gate and the drain of the N-channel MOSFET Q6 are commonly connected to the power supply voltage line VDD of the circuit so as to have a diode configuration.

The P-well PWEL on which the N-channel MOSFET Q6 of the source line control circuit is formed is not connected to the power supply voltage VDD like the P-well PWEL of the memory cell array unit, but is connected to the source of the MOSFET Q6, that is, the above-described source line VDD-CEL. The power supply voltage VDD is fed to the N-well NWEL on which the P-channel MOSFETs Q4 and Q5 of the source line control circuit are formed. Therefore, these MOSFETs Q4 and Q5 may be formed on the same N-well NWEL or they may be formed on the N-well NWEL on which the P-channel MOSFETs of the memory cell MC are formed.

Figure 8:
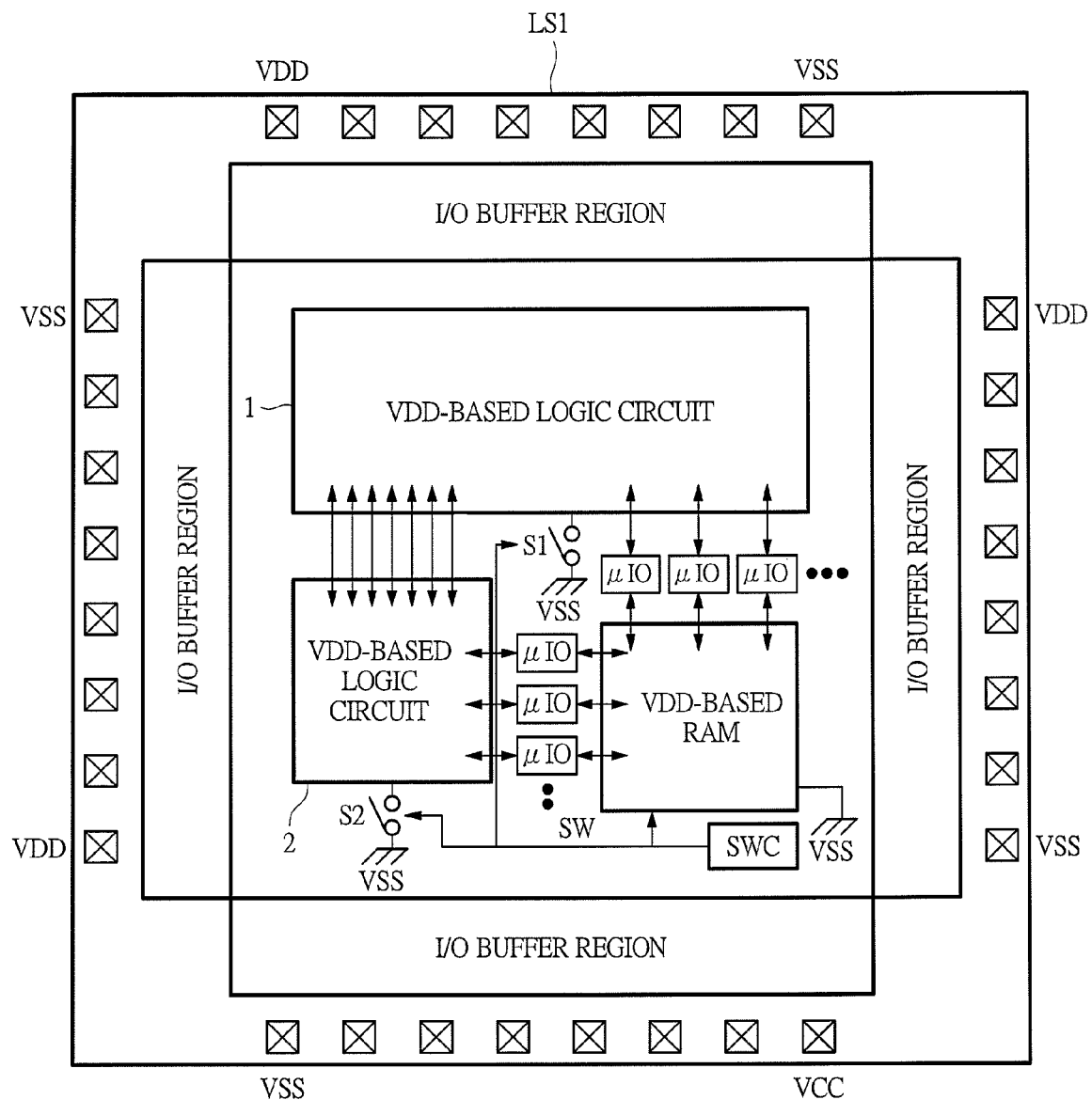
FIG. 8 is a block diagram showing an embodiment of a semiconductor integrated circuit device according to the present invention.

FIG. 8 shows a block diagram of an embodiment of the semiconductor integrated circuit device (semiconductor device) according to the present invention. In FIG. 8, though not particularly limited, operations are performed by two kinds of power supply voltages VCC and VDD. Also, though not particularly limited, the power supply voltage VCC is a comparatively high voltage such as 3.3 V, and the power supply voltage VDD is a comparatively low voltage such as 1.2 V. The comparatively high power supply voltage VCC and the ground potential VSS corresponding thereto are fed for I/O (input/output) buffers provided in the periphery of a chip. The comparatively low power supply voltage VDD and the ground potential VSS corresponding thereto are fed to VDD-based logic circuits 1 and 2, a VDD-based RAM, and a power supply control circuit SWC. The ground potential VSS of the circuit is selectively fed to the VDD-based logic circuits 1 and 2 by power supply switches S1 and S2. On the other hand, such a power supply switch is not provided for the VDD-based RAM, and the power supply voltage VDD and the ground potential VSS are always fed thereto. Further, the power supply voltage VDD and the ground potential VSS are always fed also to the power supply control circuit SWC.

The VDD-based logic circuits 1 and 2 do not perform any operation in the standby state in which the semiconductor integrated circuit device does not perform any operation. Therefore, leakage currents in the standby state are reduced by turning the switches S1 and S2 as described above into an OFF state. On the other hand, since the VDD-based RAM has to perform a data retention operation, different from the above-described VDD-based logic circuits 1 and 2, the switches S1 and S2 cannot be provided. Therefore, the source line control circuit as described above is provided for the VDD-based RAM, thereby reducing the leakage currents in the memory cells MC in the standby state. The control signal SW formed in the power supply control circuit SWC is also fed to the VDD-based RAM to be a control signal of the source line control circuit. Micro input/output circuits μIO are provided between the VDD-based logic circuits 1 and 2 and the VDD-based RAM. The micro input/output circuits μIO are used for the prevention of irregular level propagation when the power supply of the VDD-based logic circuit 1 or 2 is cut off.

In the foregoing, the invention made by the inventors of the present invention has been concretely described based on the embodiments. However, it is needless to say that the present invention is not limited to the foregoing embodiments and various modifications and alterations can be made within the scope of the present invention. For example, various configurations can be employed as the well configuration of the memory cell array. The N-channel MOSFETs and the P-channel MOSFETs constituting the source line control circuit may be separately provided in each memory cell in the word line direction or the bit line direction. When the MOSFETs are separately disposed as described above, by virtue of wiring resistance or the like in the source line VSS-CEL or VDD-CEL, for example, in 256×256 memory cells disposed in the memory cell array, uneven variations of the source potential thereof can be prevented. Particularly, responsivity in the case where a transition is made from the standby state to an active state can be enhanced. The invention of the present application can be widely utilized in SRAMs and semiconductor devices on which the SRAMs are mounted.

What is claimed is:

1. A semiconductor device comprising:
a memory cell array including plural static memory cells provided at intersecting portions of plural word lines and plural complementary bit lines,
wherein the static memory cell includes: first and second CMOS inverter circuits whose inputs and outputs are cross-connected to each other; and selection switch MOSFETs provided between input terminals of the first and second CMOS inverter circuits and corresponding complementary bit lines, gates of the selection switch MOSFETs being connected to corresponding word lines,
the memory cell array includes:
first and second source lines to which sources of N-channel MOSFETs and P-channel MOSFETs constituting the first and second CMOS inverter circuits constituting the plural static memory cells are connected;
a switch MOSFET provided between the first source line and a first power supply line corresponding to the first source line, turned to an OFF state in a first operation mode, and turned to an ON state in a second operation mode which is different from the first operation mode;
an N-channel MOSFET provided between the first source line and the first power supply line and having a source connected to a P well on which the N-channel MOSFET is formed, a drain and a gate of the N-channel MOSFET being connected to each other to have a diode configuration; and
a P-channel MOSFET provided between the first source line and the first power supply line and having a source connected to an N well on which the P-channel MOSFET is formed, a drain and a gate of the P-channel MOSFET being connected to each other to have a diode configuration, and
the second source line is connected to the second power supply line corresponding to the second source line.

2. The semiconductor device according to claim 1,
wherein the sources of the N-channel MOSFETs of the first and second CMOS inverter circuits constituting the static memory cell are connected to the first source line,
the switch MOSFET is an N-channel MOSFET,
a ground potential of a circuit is fed to the first power supply line, and
the sources of the P-channel MOSFETs of the first and second CMOS inverter circuits constituting the static memory cell are connected to the second source line, and
a positive power supply voltage is fed to the second source line.

3. The semiconductor device according to claim 1,
wherein the sources of the P-channel MOSFETs of the first and second CMOS inverter circuits constituting the static memory cell are connected to the first source line,
the switch MOSFET is a P-channel MOSFET,
a positive power supply voltage is fed to the first power supply line, and
the sources of the N-channel MOSFETs of the first and second CMOS inverter circuits constituting the static memory cell are connected to the second source line, and
a ground potential of a circuit is fed to the second source line.

4. The semiconductor device according to claim 1,
wherein the first operation mode is a standby state in which writing and reading operations of the static memory cell are not performed, and
the second operation mode is an active state in which a writing or reading operation of the static memory cell is enabled.

5. A semiconductor device comprising:
first and second circuit blocks which become operable when a first power supply voltage and a second power supply voltage are fed; and
a power supply control circuit,
wherein, in the first circuit block, the first or second power supply voltage is cut off in a first operation mode by a control signal from the power supply control circuit, and the first and second power supply voltages are fed in a second operation mode which is different from the first operation mode,
in the second circuit block, the first power supply voltage and the second power supply voltage are fed in the first and second operation modes,
the second circuit block includes: a memory cell array having plural static memory cells provided at intersecting portions of plural word lines and plural complementary bit lines, the static memory cell includes: first and second CMOS inverter circuits whose inputs and outputs are cross-connected to each other; and selection switch MOSFETs provided between input terminals of the first and second CMOS inverter circuits and corresponding complementary bit lines, gates of the selection switch MOSFETs being connected to corresponding word lines, the memory cell array includes:

first and second source lines to which sources of MOSFETs constituting the first and second CMOS inverter circuits constituting the plural static memory cells are connected;

a switch MOSFET provided between the first source line and a first power supply voltage line corresponding to the first source line, turned to an OFF state in the first operation mode, and turned to an ON state in the second operation mode which is different from the first operation mode;

an N-channel MOSFET provided between the first source line and the first power supply voltage line and having a source connected to a P well on which the N-channel MOSFET is formed, a drain and a gate of the N-channel MOSFET being connected to each other to have a diode configuration; and a P-channel MOSFET provided between the first source line and the first power supply voltage line and having a source connected to an N well on which the P-channel MOSFET is formed, a drain and a gate of the P-channel MOSFET being connected to each other to have a diode configuration, and the second source line is connected to the second power supply voltage line corresponding to the second source line.

6. The semiconductor device according to claim 5, wherein the sources of the N-channel MOSFETs of the first and second CMOS inverter circuits constituting the static memory cell are connected to the first source line, the switch MOSFET is an N-channel MOSFET, a ground potential of a circuit is fed to the first power supply voltage line, and the sources of the P-channel MOSFETs of the first and second CMOS inverter circuits constituting the static memory cell are connected to the second source line, and a positive power supply voltage which is the second power supply voltage is fed to the second source line.

7. The semiconductor device according to claim 6, wherein the sources of the P-channel MOSFETs of the first and second CMOS inverter circuits constituting the static memory cell are connected to the first source line, the switch MOSFET is a P-channel MOSFET, a positive power supply voltage which is the first power supply voltage is fed to the first power supply voltage line, and the sources of the N-channel MOSFETs of the first and second CMOS inverter circuits constituting the static memory cell are connected to the second source line, and a ground potential of a circuit which is the second power supply voltage is fed to the second source line.

8. The semiconductor device according to claim 5, wherein the first operation mode is a standby state of the semiconductor device, and the second operation mode is an active state of the semiconductor device.

* * * * *